US006964600B2

(12) United States Patent
Belov et al.

(10) Patent No.: US 6,964,600 B2
(45) Date of Patent: Nov. 15, 2005

(54) HIGH SELECTIVITY COLLOIDAL SILICA SLURRY

(75) Inventors: Irina Belov, Zionsville, IN (US); Lothar Puppe, Burscheid (DE); Gerd W. Passing, Hürth (DE); Thomas J. Hunt, Peekskill, NY (US)

(73) Assignee: Praxair Technology, Inc., Danbury, CT (US)

( * ) Notice: Subject to any disclaimer, the term of this patent is extended or adjusted under 35 U.S.C. 154(b) by 89 days.

(21) Appl. No.: 10/717,480

(22) Filed: Nov. 21, 2003

(65) Prior Publication Data

US 2005/0113000 A1  May 26, 2005

(51) Int. Cl.$^7$ ............................................. C09K 13/00
(52) U.S. Cl. ........................ 451/41; 451/37; 438/692; 252/79.1
(58) Field of Search ................ 451/41, 60, 36, 451/37, 446; 438/690–693; 252/79.1–79.5; 216/89, 90, 99; 51/306, 309

(56) References Cited

U.S. PATENT DOCUMENTS

| 4,525,631 | A |   | 6/1985 | Allison ........................ 290/4 |
| 5,671,851 | A |   | 9/1997 | Johnson et al. ............. 211/51 |
| 5,738,800 | A | * | 4/1998 | Hosali et al. ................ 216/99 |
| 5,759,917 | A | * | 6/1998 | Grover et al. .............. 438/690 |
| 5,770,103 | A | * | 6/1998 | Wang et al. ............... 252/79.1 |
| 6,019,806 | A |   | 2/2000 | Sees et al. ................... 51/308 |
| 6,042,741 | A |   | 3/2000 | Hosali et al. ............. 252/79.1 |
| 6,114,249 | A |   | 9/2000 | Canaperi et al. ........... 438/692 |
| 6,132,637 | A |   | 10/2000 | Hosali et al. ............. 252/79.1 |
| 6,218,305 | B1 |   | 4/2001 | Hosali et al. ............. 438/691 |
| 6,238,494 | B1 |   | 5/2001 | Segal ........................ 148/421 |
| 6,410,444 | B1 |   | 6/2002 | Kido et al. ................. 438/693 |
| 6,436,835 | B1 |   | 8/2002 | Kido et al. ................. 438/693 |
| 6,443,811 | B1 |   | 9/2002 | Nojo et al. .................. 451/41 |
| 6,471,735 | B1 |   | 10/2002 | Misra et al. ................ 51/308 |
| 6,544,892 | B2 |   | 4/2003 | Srinivasan et al. ......... 438/692 |
| 6,616,514 | B1 | * | 9/2003 | Edelbach et al. ............ 451/60 |
| 2002/0142600 | A1 |   | 10/2002 | Jacquinot et al. .......... 438/690 |
| 2002/0195421 | A1 |   | 12/2002 | Srinivasan et al. ......... 216/38 |
| 2003/0006397 | A1 |   | 1/2003 | Srinivasan et al. ........ 252/79.1 |
| 2003/0171072 | A1 |   | 9/2003 | Ward et al. .................. 451/28 |

FOREIGN PATENT DOCUMENTS

| EP | 846740 | 6/1988 |
| EP | 1116762 | 7/2001 |
| EP | 1160300 | 12/2001 |

OTHER PUBLICATIONS

Zhao et al, "Direct CMP for STI", Semiconductor International (2001) pp. 145-150.
Bonner et al, "Improved Direct Polish STI CMP Process with High Selectivity Slurry:Reduced Microscratching & Increased Productivity", Proceedings of 2002 CMP-MIC, pp 247-254.

(Continued)

Primary Examiner—Lee D. Wilson
Assistant Examiner—Anthony Ojini
(74) Attorney, Agent, or Firm—Iurie A. Schwartz

(57) ABSTRACT

Provided is a novel high selectivity aqueous slurry composition method of utilizing same. The composition includes non-modified silica based abrasive particles in an amount of about 5 to about 50 weight percent, and an organic compound in an amount of about 0.001 to about 2.0 weight percent in an aqueous solution, wherein the silicon oxide to silicon nitride selectivity ratio ranges from about 50 to about 700.

22 Claims, 2 Drawing Sheets

HS STI Slurry Containing NH₄DDBS:
Selectivity vs. pH

Selectivity of STI slurries containing 0.3 weight percent of different organic compounds; pH of 2.2.
Slurry A - ALS; Slurry B - DDBSA; Slurry C - NH4DDBS;
Slurry D - TEA-DDBS; Slurry F - None.

OTHER PUBLICATIONS

Garliardi et al, "Fixed Abrasives and Selective Chemistries: Some Real Advantages for Direct STI CMP", Proceedings of 2002 CMP-MIC, pp 288-290.

Tseng et al., "STI CMP Process with High—Selectivity Slurry", Proceedings of 2002 CMP-MIC, pp. 255-259.

Leduc et al, "CMP:Aiming for Perfect Planarization", Proceedings of 2002 CMP-MIC, pp 239-246.

Devriendt et al, "Challenges for the Integration of Shallow Trench Isolation", Proceedings of 2003 CMP-MIC, pp 492-500.

Cook, "Chemical Processes in Glass Polishing", Journal of Non-Crystalline Solids (1990) pp 152-171.

Lo et al, "Characterization of Selective-CMP, Dummy Pattern and Reverse Mask Approaches in STI Planarization Process", Proceedings of 1999 CMP-MIC, pp-333-335.

Lee et al., "The Effects of Slurries with Pattern Size and Step Height in Shallow Trench Isolation Chemical Mechanical Polishing", Proceedings of 2000 CMP-MIC, pp 288-290.

Jin et al., "Advanced Front End CMP and Integration Solutions", Proceedings of 2000 CMP-MIC, pp 119-129.

Bonner et al., "Development of a Direct Polish Process for Shallow Trench Isolation Modules", Proceedings of 2001 CMP-MIC, pp. 572-579.

Xiao, "Introduction to Semiconductor Manufacturing Technology", Prentice-Hall Inc. (2001) pp. 384.

Nickles et al., "Meeting the Challenges of STI CMP", Nanochip Technology Journal (2003) pp. 42-45.

Lampara et al., "A High Oxide—Nitride Selectivity CMP Slurry for Shallow Trench Isolation", Electrochemical Society Proceedings, vol. 98-7, pp 218-234.

* cited by examiner

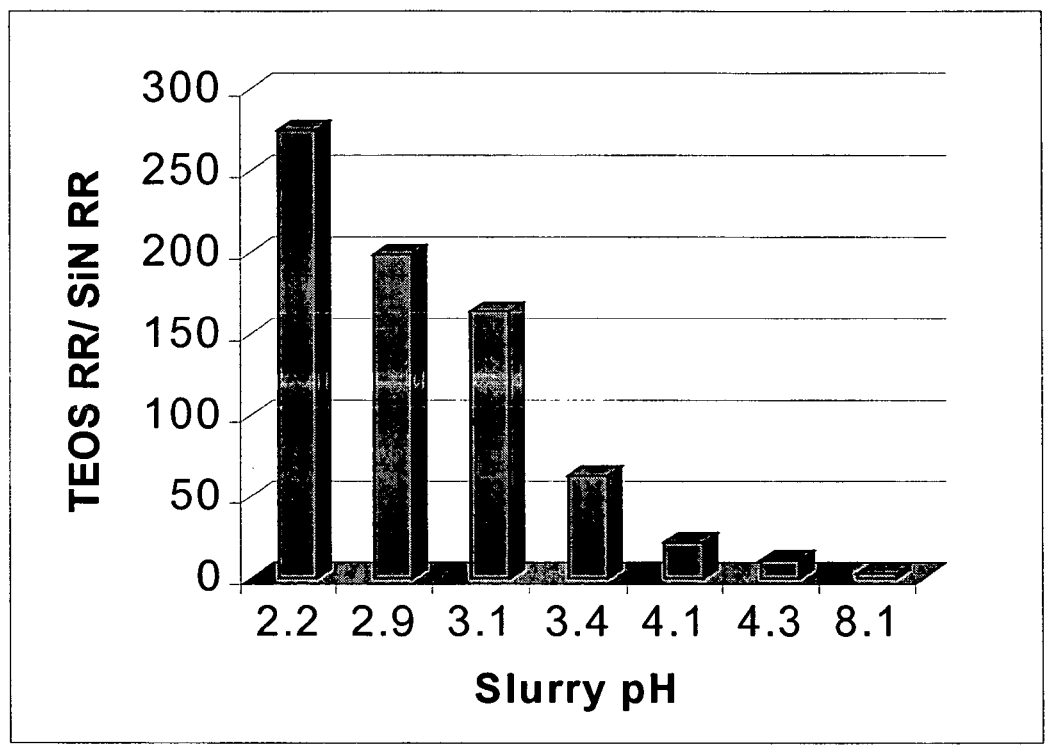
Fig.1. HS STI Slurry Containing NH₄DDBS: Selectivity vs. pH

Fig 2. Selectivity of STI slurries containing 0.3 weight percent of different organic compounds; pH of 2.2.
Slurry A – ALS; Slurry B – DDBSA; Slurry C – NH4DDBS; Slurry D – TEA-DDBS; Slurry F – None.
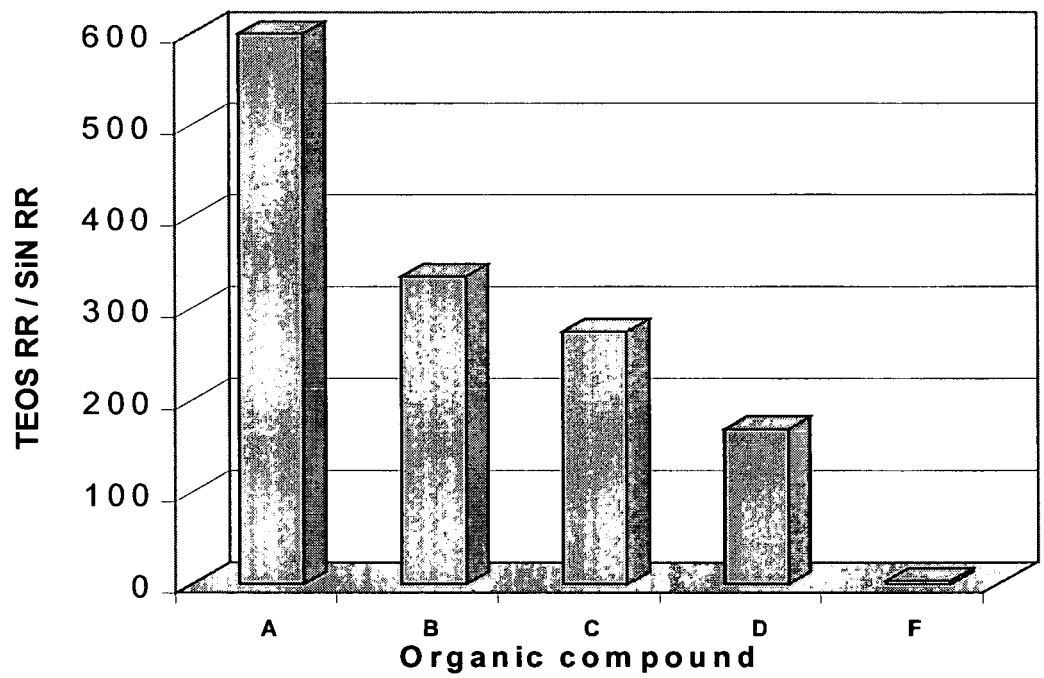

US 6,964,600 B2

HIGH SELECTIVITY COLLOIDAL SILICA SLURRY

BACKGROUND OF THE INVENTION

1. Field of the Invention

The present invention relates to high selectivity aqueous slurries for the Chemical Mechanical Polishing/Planarization of substrates. The slurries of the present invention are useful for polishing an insulator film of a semiconductor device and in particular for processing shallow trench isolation structures on semiconductor substrates. The slurries include an aqueous medium, non-modified colloidal silica abrasive particles and one or more organic compounds which provide removal of silicon oxide selectively over silicon nitride.

2. Description of Related Art

Chemical Mechanical Polishing/Planarization (CMP) has become a useful technology in the field of integrated circuits (IC) fabrication, where the surface of the semiconductor substrate is planarized and subsequent circuit patterns are laid down. Although polishing and planarization may be utilized interchangeably herein, it will be recognized by those skilled in the art that CMP encompasses both. Global planarization of topological features is commonly utilized in the manufacturing of high performance ultra-large scale (ULSI) devices. Structures having increasingly smaller device dimensions, increasing packaging density and multiple metal-insulator wiring levels impose stringent demands on planarity. Depth-of-focus requirements of photolithography masking processes put additional demands on topographical height variation, as non-planarity impacts on both IC device yield and performance.

Shallow Trench Isolation (STI) has become an enabling technology in the IC fabrication, where the number of neighboring transistors have been increased and the planarity has been improved, thereby replacing the Local Oxidation of Silicon (LOCOS) technique for sub-250 nm devices.

In STI processes, isolation trenches are plasma etched in the silicon utilizing a silicon nitride etch mask, and over-filling the trenches with silicon oxide, deposited via high density plasma chemical vapor deposition (HDP CVD) or plasma enhanced CVD (PECVD). Thereafter, the oxide is polished back to a planar surface via CMP. The sacrificial silicon nitride layer is chemically stripped and active devices are fabricated in the exposed silicon regions.

The STI CMP process performance is characterized by the post-polish trench oxide thickness and active area silicon nitride thickness, as well as within-die (WID) and within-wafer (WIW) thickness ranges. This set of parameters ultimately determines the height between the active silicon area of the transistor and the oxide in the trench, after the nitride stop layer has been removed.

Ideally the CMP process stops on the nitride barrier layer. However, due to the local polishing differences, small features polish faster than large features, whereas removal rate is inversely proportional to the pattern density (i.e., oxide in narrow trenches, polish slower than in wider trenches). This results in so-called nitride erosion (e.g., WID nitride thickness variation between active area feature of varying size and pattern density). Field oxide loss or so-called trench oxide dishing is another CMP related problem having a negative impact on the surface planarity.

Different approaches and integration solutions have been developed to decrease the pattern dependency impact of STI CMP, such as adding dummy features, varying pad stack, using fixed-abrasive pads, as well as slurry engineering.

One of the effective integration approaches to the direct STI CMP is based on using high selectivity slurry. The selectivity of a STI slurry is defined as the ratio of the material removal rate (RR) of oxide to that of silicon nitride.

One type of high-selectivity slurry system proposed for the STI CMP process has been the ceria-based slurry. Ceria particles are utilized as an abrasive component in an aqueous system due to their high rate of removal at low particle concentration. For example, U.S. Pat. Nos. 5,738,800, 6,042,714, 6,132,637 and 6,218,305 to Hosali et al disclose a polishing slurry composition for polishing a composite of silicon dioxide and silicon nitride. The slurry includes up to 5 weight percent ceria, a compound which complexes with silicon dioxide and silicon nitride and a surfactant affecting the silicon nitride removal.

Another ceria-based STI slurry composition is disclosed in U.S. Patent Application Publication Nos. 20020195421 and 20030006397 to Srinivasan et al. The combination of ceria abrasives with amino acids as selectivity enhancing compounds is claimed to provide oxide/nitride selectivity of 100 and higher for blanket films.

U.S. Pat. Nos. 6,114,249 and 6,436,835 describe a composition containing cerium oxide and a water-soluble organic compound having at least one group of —COOH, —COOMx (wherein Mx is an atom or a functional group capable of substituting an H atom to form a slat), —$SO_3H$ or $SO_3My$ (wherein My is an atom or a functional group capable of substituting an H atom to form a salt).

Commercially available ceria-based slurries include the Hitachi HS-8005 slurry combined with HS-8102GP (a proprietary selectivity additive). One of the disadvantages associated with the latter slurry is that it is a two-component system, which requires mixing prior to employing it. The mixing ratio governs the slurry performance including the removal rate, selectivity and dishing. Furthermore, handling and pot life (i.e., slurry residence after mixing the components) has been found to impact process performance. Therefore, mixing the components becomes of utmost importance, requiring utilization of special mix-in-place systems, which provide precise mixing and minimize the slurry residence time. See, T-C. Tseng, et al., *STI CMP Process with High-Selectivity Slurry*, Proceedings of 2002 CMP-MIC, pp. 255–259; Benjamin A. Bonner, et al., *Development of a Direct Polish Process for Shallow Trench Isolation Modules*, Proceedings of 2001 CMP-MIC, pp. 572–579).

A further disadvantage associated with the aforementioned ceria based slurries is that ceria is an abrasive powder of $CeO_2$. This powder has a significantly lower suspension stability, as compared to colloidal particles. Therefore, the ceria-based slurries require to be maintained in a state of agitation to prevent sedimentation and packing of the particles.

Further, utilizing powder-derived ceria abrasive particles which are harder than colloidal silica particles, have larger mean sizes and irregular morphology, results in decreased quality of the polished wafer surface including, but not limited to higher surface roughness and defects. Additionally, the formation of microscratches on the wafer surface is a great concern when using ceria-based slurries.

Another type of ceria-based system for STI CMP is the so-called "topography selective" slurries. See, Patrick Leduc, et al., *CMP: Aiming for Perfect Planarization*, Proceedings of 2002 CMP-MIC, pp. 239–246. In general, topography selective slurries belong to the class of so-called "pressure sensitive slurries". These slurries are broadly defined as having non-linear (i.e., non-Prestonian) relationship between the rate of removal and pressure. These slurries are considered to have a different mechanism of interaction between the abrasive particles, additives and polished films. They exhibit very low oxide removal on blanket wafers, but the removal rate increases on patterned wafers having a pronounced topography (i.e., difference in local pressures).

In spite of very good planarization efficiency and low nitride erosion reported when using this STI CMP slurry, there is the major disadvantage associated with the topography selective slurries—the very strong dependency of oxide polishing rate on the mask layout. Careful control on the overfill oxide thickness is required for the wafer to be completely cleared. See, Ping-Ho Lo et al., *Characterization of Selective-CMP, Dummy Pattern and Reverse Mask Approaches in STI Planarization Process*, Proceedings of 1999 CMP-MIC, pp. 333–335.

There is difficulty removing residual oxide (e.g., when the topography becomes less pronounced) and the oxide removal rate significantly decreases for patterns with low density. Accordingly, these slurries are not efficient for particular STI formation processes, which do not generate explicit step height.

Several slurry systems based on colloidal silica particles have been proposed for STI CMP. Colloidal silica slurries are stable against settling, thereby eliminating need for agitating the system so as to prevent sedimentation, agglomeration and hard packing. Moreover, the smaller particle size and spherical morphology reduces the defects (i.e., microscratches) that may occur on the wafer surface when utilizing ceria abrasive particles.

Because of these advantages, some semiconductor chip manufacturers employ conventional, non-selective colloidal silica based slurries for STI-CMP. These slurries provide oxide/nitride selectivity ratios from 3 to 4 in blanket films; this selectivity might further be reduced on patterned wafers. Frequently this results in over-polish, under-polish and non-uniform thickness. To overcome these problems, slower polishing rates, stringent process and end-point controls are applied to achieve required product quality. These measures reduce efficiency, throughput and increase manufacturing cost. Significant efforts have been undertaken to increase selectivity of these slurries.

U.S. Pat. No. 4,525,631 to Silvestri et al describes a slurry containing about 6 weight percent colloidal silica adjusted to a pH of about 12 with KOH. The slurry provides oxide/nitride selectivity of about 10. Similarly, U.S. Pat. No. 6,019,806 to Sees et al discloses an approach to enhancing selectivity by increasing the pH of colloidal silica to about 13. The highest selectivity attained was about 15.

U.S. Pat. No. 5,671,851 to Beyer et al describes adding small amounts of Na salt of dichoroisocyanuric acid and sodium carbonate to attain a selectivity of 6.2. U.S. Pat. No. 6,114,249 to Canaperi et al discloses a colloidal silica slurry containing trietnolamine to attain a selectivity of 28.

U.S. Pat. No. 5,759,917 describes an STI CMP slurry including fumed silica particles, a carboxylic acid and a soluble cerium compounds. As shown in the examples, the selectivity is less than 20.

European Patent Publication 0 846 740 to Morrison et al disclose the selectivity of conventional colloidal silica slurry increased to as high as 30 by adding tetramethyl ammonium hydroxide and hydrogen peroxide.

Some of the disadvantages associated with the related colloidal silica slurries include the selectivity not being high enough, particularly when polishing patterned wafers. Integration issues for advanced generations of IC devices require very low oxide dishing and nitride loss. As device pitch continues to shrink, isolation trench aspect ratio increases and nitride layers become thinner. This reduces the margin for nitride loss during STI CMP process.

To overcome the disadvantages associated with the related art slurries and to meet the high planarity requirement for small feature size devices, a high selectivity colloidal silica based slurry is provided.

Another object of the invention is to provide a one-component, ready to use slurry system.

It is a further object of the invention to provide a slurry system for producing a high throughput for advanced devices, yet have an end-point control through selectivity.

It is yet another object of the invention to provide a non-modified colloidal silica based slurry, which minimizes the silicon nitride erosion.

Other objects and advantages of the invention will become apparent to one skilled in the art on a review of the specification, figures and claims appended hereto.

SUMMARY OF THE INVENTION

The foregoing objectives are met by the high selectivity slurry composition, system, and method of the present invention.

According to a first aspect of the invention, a high selectivity aqueous slurry composition is provided. The composition includes non-modified silica based abrasive particles in an amount of about 5 to about 50 weight percent, and an organic compound in an amount of about 0.001 to about 2.0 weight percent in an aqueous solution. The silicon oxide to silicon nitride selectivity ranges from about 50 to about 700.

According to another aspect of the invention, a method for chemical mechanical polishing/planarization (CMP) of a semiconductor device is provided. The method includes applying a high selectivity slurry at a polishing interface between a polishing pad and the semiconductor device, the semiconductor device including silicon oxide and silicon nitride. The high selectivity slurry includes non-modified silica based abrasive particles in an amount of about 5 to about 50 weight percent, and an organic compound in an amount of about 0.001 to about 2.0 weight percent in an aqueous solution. The slurry selectively polishes silicon oxide in preference to silicon nitride at removal selectivity ranging from about 50 to about 700.

According to a further aspect of this invention, a method for polishing/planarizing a shallow trench isolation structure of a semiconductor device is provided. The method includes providing a high selectivity slurry including non-modified abrasive particles in an amount of about 5 to about 50 weight percent, and an organic compound in an amount of about 0.001 to about 2.0 weight percent in an aqueous medium. The high selectivity slurry is applied at a polishing/planarizing interface between a polishing pad and a device comprised of silicon oxide and silicon nitride. The silicon oxide is selectively polished in preference to silicon nitride at selectivity ranging from about 50 to about 700.

According to yet another aspect of the invention a method of making a high selectivity aqueous slurry composition is provided. The method includes providing non-modified silica based abrasive particles in an amount of about 5 to about 50 weight percent, and an organic compound in an amount of about 0.001 to about 2.0 weight percent in an aqueous solution, wherein the silicon oxide to silicon nitride selectivity ranges from about 50 to about 700.

BRIEF DESCRIPTION OF THE FIGURES

The invention will be better understood by reference to the figures wherein like numbers denote same features throughout and wherein:

FIG. 1 illustrates the selectivity of the STI slurry of the invention as a function of pH; and FIG. 2 illustrates the selectivity of the STI slurry of the invention containing different organic compounds.

DETAILED DESCRIPTION OF THE INVENTION

The manufacturing of IC devices requires numerous complicated steps necessary to form the various features onto the substrate. The present invention relates to a new slurry composition for performing a CMP step during semiconductor device processing, and particularly shallow trench isolation fabrication. In particular, the invention is a one-component high selectivity aqueous slurry system. As utilized herein, the term "one-component" refers to a ready-to-use system, without having to mix components prior to use. Thus, slurry handling is simplified, and the use of precise mixing equipment is eliminated.

It will be recognized by those skilled in the art, that the term "selectivity" as utilized throughout the specification and the appended claims describes the rate of removal of silicon dioxide to the rate at which silicon nitride is removed by same slurry composition/system during the CMP process. Selectivity is determined by dividing the rate at which silicon dioxide film is removed (usually expressed in terms of Å/min) by the rate at which silicon nitride film is removed.

The slurry system according to the present invention includes abrasive non-modified silicon dioxide particles and an organic compound (or a blend of organic compounds) in an aqueous medium. The organic compound introduced into the slurry, significantly suppresses the silicon nitride removal, while not influencing the silicon oxide removal rate. Thus, the slurry formed is a high selectivity slurry with a high oxide to nitride selectivity.

The non-modified abrasive particles utilized in the aqueous slurry medium perform the function of mechanical grinding. The non-modified silica based abrasive can be selected from among colloidal, fumed, precipitated and powder milled silica. Preferably, the abrasives are colloidal silica particles. By non-modified colloidal silica based abrasive is meant colloidal silica particles which have not been modified by tri- or tetravalent metal oxides such as aluminum, chromium, gallium, titanium or zirconium. These abrasive particles are particularly useful due to their substantially spherical morphology and stable particle suspension in an aqueous medium (i.e., non-agglomeration). Non-modified colloidal silica may be obtained by any method known in the art, such as by ion-exchange of a silicic acid salt or by sol-gel technique (e.g., hydrolysis or condensation of a metal alkoxide, or by peptization of precipitated hydrated silicon dioxide, etc.). Since metal ion impurities such as iron, nickel, and lead may migrate in the semiconductor device after the polishing step, and, therefore, lead to lower device yields, the non-modified colloidal silica utilized is high purity.

The average particle size of the silica particles is in the range from about 10 nm to about 200 nm, preferably from about 20 nm to about 140 nm, and more preferably about 30 nm to about 90 nm. When the average particle size is less than 10 nm it is not possible to obtain a slurry with adequate high removal-rate of oxide film. On the other hand, when particle size is larger than 200 nm it will cause an increased number of defects and undesired roughness of the polished surface. "Particle size", as utilized herein will be understood to denote the average diameter of the particles as measured by standard particle sizing instruments and methods, such as dynamic light scattering, laser diffusion diffraction, or ultra-centrifuge analysis techniques.

The content of non-modified silica particles in the aqueous medium may range from about 5 to about 50 weight percent, preferably from about 10 to about 40 weight percent, and more preferably from about 25 to about 35 weight percent of the total weight of the slurry system. If the silica content is less than 5 weight percent the removal rate of silicon oxide film is very low. On the other hand, if the content is higher than 50 weight percent, it may destabilize the slurry system.

The organic compound constituent added to the aqueous slurry medium has been found to suppress the removal of silicon nitride and is, therefore, considered to be a selectivity-enhancing ingredient.

The organic compound utilized to enhance selectivity have been found to belong to the following families:
  sulfates of alcohols;
  sulfonic acids and their salts;
  sulfuric acid ether salts.

Preferable organic compounds from the family of sulfates of alcohol are alcohol sulfates of ammonium, sodium, potassium, magnesium and calcium, such as lauryl sulfates, decylsulfates, octylsulfates, ethylhexylsulfates and the like; also advantageous are alkylsulfates of amines, such as of triethanolamine, diethanolamine and the like.

From the family of sulfonic acids and their salts are alkyl benzene sulfonic acids, sulfonates of dodecyl- and tridecyl-benzenes, sulfonates of naphthalene, sulfonates of alkyl naphthalene and the like.

Exemplary organic compounds from the family of sulfuric acid ether salts are higher alcohol ether sulfates of ammonium, sodium and the like, alkyl phenol ether sulfates and the like.

Among these preferred compounds from the aforementioned families, the most preferred organic compounds utilized as selectivity enhancing components in the STI slurry of the present invention are, the following:
  lauryl sulfates, particularly ammonium lauryl sulfate, diethanolamine lauryl sulfate, triethanolamine lauryl sulfate;
  dodecylbenzenesulfonic acid and its salts, particularly ammonium or potassium dodecylbenzenesulfonate, as well as triethanolamine or isopropylamine dodecylbenzenesulfonates; and
  linear alkylate sulfonates of triethanolamine, diethanolamine or isopropanolamine.

While not wishing to be bound by any particular theory, it is believed that the organic compounds in the present slurry system inhibit the attack of the abrasive particles onto the surface of the silicon nitride film, thus, significantly decreasing the removal rate during the CMP process.

The content of the organic compound in the slurry may be up to the critical micelle concentration, preferably from about 0.001 to about 2.0 weight percent, more preferably 0.05 to about 1.5 weight percent and most preferably about 0.1 to about 0.9 weight percent. It will be appreciated by those skilled in the art that should the amount of organic compound exceed the upper limit of the said broad range, it might cause undesirable effects such as foaming, or destabilization of the slurry.

These organic compounds exhibit properties of anionic surfactants and when added to the non-modified colloidal silica produce a slurry with oxide:nitride removal selectivity from about 50 to about 700, depending on the particular organic compound chosen, and the pH of the slurry.

The slurry composition/system may optionally contain other components such as pH adjusting constituents including inorganic and/or organic bases and acids, pH buffers, additives to control foaming and viscosity modifiers such as surface active agents.

As aforementioned, the selectivity of the slurry may be adjusted by controlling the pH. As illustrated in FIG. 1, and discussed in the examples, the selectivity varies by two orders of magnitude in a pH range from about 1.5 to about 8. The pH chosen is based on the required selectivity with respect to optimizing the particular CMP process, while simultaneously taking into consideration the long-term stability of the slurry. The preferred pH range is from about 1.5 to about 4.5 and most preferably about 2.0 to about 3.0.

Exemplary pH adjusting constituents include alkali metal hydroxides such as potassium hydroxide, sodium hydroxide, and the like. Additional exemplary constituents include ammonia, and organic bases such as triethanolamine, tetramethylammonium hydroxide and the like.

Surface active agents can also be employed in the present invention. The surface active agents regulate the surface tension and control the foaming of the slurry system. Surfactants which contain a range of perfluoroalkyl groups (fluorosurfactants) are the preferred class of surface tension reducing agents. These surfactants are effective in small concentrations and stable in aqueous dispersions in the presence of acids and alkalis. Examples of these surface active agents include ZONYL®, fluorosurfactants manufactured by DuPont.

The slurries of the present invention are formed by combining the components thereof. Regardless of the order, however, the aqueous slurry composition is formed prior to application of the slurry to at a polishing interface between a polishing pad and the composite device. This allows the one-component system to be stored prior to use. When storage is necessary or convenient, the composition is stored below about 30° C., but above the freezing temperature of the slurry composition.

The aqueous slurry system of the present invention is characterized by a high removal rate ratio between the silicon oxide and silicon nitride, wherein the ratio (selectivity) ranges from about 50 to about 700.

The non-modified colloidal silica slurries of the present invention will be further described in detail with reference to the following examples, which are, however, not to be construed as limiting the invention.

EXAMPLES

The aqueous slurries of Examples 1–12, described below, were used for polishing 200 mm blanket silicon dioxide (plasma enhanced tetra-ethyl ortho silicate (PETEOS), 15K Å thickness film and silicon nitride (low pressure $Si_3N_4$), 2K Å thickness film) wafers.

Polishing conditions were as follows:
  CMP Tool: IPEC/Speedfam 472;
  Polishing pad: IC-1000 stacked pad with SubaIV subpad by Rodel Co., Inc.;
  Down force: 4 psi;
  Back pressure: 1 psi;
  Platen rotation speed: 60 rpm;
  Wafer carrier rotation speed: 40 rpm;
  Slurry flow rate: 200 mill/min;
  Polishing time: 2 min;
  Pad conditioning: in-situ.

Polishing rate (Å/min)=initial thickness of each film minus after-polishing film thickness divided by polishing time. Oxide and nitride film thickness data have been obtained by Prometric FT650 tool; 49 points polar scan has been used for metrology.

Example 1

The slurry has been prepared by adding 42 g of ammonium lauryl sulfate (ALS) (as 30 percent ALS aqueous solution, Sigma-Aldrich) to 2.5 liters of commercial non-modified silica colloid (LEVASIL, H.C. Starck, Inc.) with pH of 2.20; silica content in the slurry is 30 weight percent, average particle size was 45 nm. The slurry pH had been equal to 2.45; the amount of ALS in the slurry was equal to 0.4 weight percent.

As a result, in the above-described polishing test, the removal rate (RR) for silicon oxide film was at 2189 Å/min and the RR for silicon nitride layer was extremely low and equal to 12 Å/min; the oxide:nitride RR selectivity was found to be 186.

Examples 2–4

Slurries of Examples 2–4 were prepared in a similar manner to the slurry of Example 1, except for varying pH and amount of ALS. In the slurry of Example 2, pH was equal to 2.20; pH of the slurries in Examples 3 and 4 has been adjusted by adding 0.5N aqueous solution of KOH. Also, commercial product Stepanol AM-V (Stepan Co.) has been used as a source of ALS (as 28% aqueous solution of ALS).

Polishing tests on blanket wafers have been performed, as described above and compared to a slurry which does not contain organic compound. The results are tabulated in Table 1, below.

TABLE 1

Removal Rate and Selectivity of HS STI Slurries Containing ALS

| | Amount of ALS, weight percent | Slurry pH | RR of TEOS Å/min | RR of $Si_3N_4$ Å/min | Selectivity TEOS/$Si_3N_4$ |
|---|---|---|---|---|---|
| Example 1 | 0.4 | 2.45 | 2189 | 12 | 186 |
| Example 2 | 0.4 | 2.17 | 1854 | 3 | 600 |
| Example 3 | 0.4 | 2.78 | 2267 | 12 | 182 |
| Example 4 | 0.8 | 2.83 | 2431 | 17 | 150 |
| Comparison | None | 2.35 | 2418 | 703 | 3.3 |

As seen from the data, oxide:nitride selectivity as high as 600 has been achieved with the slurries of the present invention; in addition, it has been observed that selectivity decrease as the slurry pH increased.

Additionally, it is noted that the removal rate of silicon dioxide film is about 2000 Å/min and practically independent of ALS presence. This relatively high oxide RR on blanket wafers indicates that HS STI slurries of the present invention are not topography-sensitive, but high selectivity is caused by suppressing the removal of silicon nitride film, due to the presence of ALS.

To demonstrate suppressing action of ALS added to colloidal silica dispersion on silicon nitride removal, the above described polishing test has been performed for the same non-modified colloidal silica slurry as in Examples 1–4, but not containing ALS. As seen from Table 1, very low selectivity of 3.3 has been observed for this slurry, which is typical of conventional colloidal silica slurries known in the art.

Examples 5–7

Slurries of Examples 5–6 have been prepared by adding 150 g of ammonium dodecylbenzenesulfonate ($NH_4DDBS$) aqueous solution to 4.0 liters of non-modified colloidal silica dispersion in water so the content of $NH_4DDBS$ was 0.31 weight percent. The slurry pH was adjusted to 2.28 and 2.93, for each of the Examples 5 and 6, respectively, by adding $NH_4OH$ (as 1M aqueous solution). Silica content in the slurry was 30 weight percent and average particle size was 65 nm.

Solution of $NH_4DDBS$ for the slurries of Example 5 and 6 has been prepared by adding 65 ml of 1M aqueous solution of $NH_4OH$ to 220 g of 12.5 weight percent aqueous solution of Dodecylbenzenesulfonic acid (DDBSA). The resulting aqueous solution of $NH_4DDBS$ had a pH of 7.82.

The slurry of Example 7 was prepared by adding 150 g of $NH_4DDBS$ aqueous solution and 10 g of ZONYL FSP fluorosurfactant (DuPont Co.,Inc) to 4.0 liters of non-modified colloidal silica dispersion in water; slurry pH was adjusted to a pH of 3.13.

Polishing tests on blanket wafers have been performed, as described above and the results are tabulated in Table 2, below.

TABLE 2

Removal Rate and Selectivity of HS STI Slurries Containing $NH_4DDBS$.

|  | Slurry pH | RR of TEOS, Å/min | RR of $SI_3N_4$, Å/min | Selectivity TEOS/$Si_3N_4$ |
|---|---|---|---|---|
| Example 5 | 2.28 | 1892 | 7 | 275 |
| Example 6 | 2.93 | 2237 | 11 | 199 |
| Example 7 | 3.13 | 2213 | 21 | 104 |

As seen from comparison of the data in Tables 1 and 2, HS STI slurries containing $NH_4DDBS$ exhibit a similar dependency (i.e., fine-tuning) of selectivity based on pH adjustment, as those containing ALS.

Example 8

To further explore removal selectivity based on pH adjustment, several $NH_4DDBS$ containing HS STI slurries were prepared similar to the slurry of Example 5, except the pH was adjusted within the range from 3.4 to 8.1 by adding $NH_4OH$ (as 1M aqueous solution).

Polishing tests on blanket wafers have been performed, as described above. The results on selectivity are presented in FIG. 1, together with the results on Examples 5 to 7.

As seen from the FIG. 1, removal selectivity depends strongly on the slurry pH, decreasing more than two orders of magnitude with a pH increase from 2 to 8. Thus, the preferred pH range for HS STI slurries of the present invention is about 1.5 to about 4.5, and preferably from about 2.0 to about 3.0.

The observed strong pH dependency of oxide: nitride removal selectivity means that selectivity might be optimized (i.e., fine tuned), by adjusting the slurry pH, to meet requirements of a particular STI CMP process.

Example 9

The slurry has been prepared by adding 225 g of 12.7 weight percent aqueous solution of dodecylbenzenesulfonic acid (DDBSA) to 2.5 liters of non-modified colloidal silica dispersion in water with pH of 9.30; silica content in the slurry was 30 weight percent and had an average particle size of 40 nm. The slurry pH was equal to 2.96; the amount of DDBSA in the slurry was equal to 0.9 weight percent.

Polishing tests on blanket wafers have been performed, as described above; selectivity of oxide vs. nitride film removal was found to be 175.

Example 10 to 11

Slurries of Examples 10 and 11 have been prepared by adding an aqueous solution of triethanolamine dodecylbenzenesulfonate (345 g of 4 weight percent aqueous solution of TEA-DDBS) to 4.0 liters of non-modified colloidal silica dispersion in water with pH of 2.20; silica content in the slurry is 25 weight percent, and average particle size of 72 nm. Commercial product BioSoft N300 (60 weight percent aqueous solution of TEA-DDBA, manufactured by Stepan Co) has been used as a source of TEA-DDBA. Slurry pH has been adjusted to pH of 2.45 and 2.75, respectively. The amount of TEA-DDBS in the slurry was equal to 0.3 weight percent.

Polishing tests on blanket wafers have been performed, as described above; the results are tabulated in Table 3, below.

TABLE 3

Removal Rate and Selectivity of HS STI Slurries Containing TEA-DDBS.

|  | Slurry pH | RR of TEOS, Å/min | RR of $Si_3N_4$, Å/min | Selectivity TEOS/$Si_3N_4$ |
|---|---|---|---|---|
| Example 10 | 2.25 | 1916 | 11 | 169 |
| Example 11 | 2.75 | 2570 | 17 | 154 |

Example 12

Comparison of data in Examples 1–11 demonstrates that selectivity of oxide versus nitride film removal of HS STI slurries of the present invention varies significantly depending on which type of the aforementioned organic compound—nitride removal suppressant—the slurry contains.

FIG. 2 illustrates the removal selectivity for slurries, prepared with different organic compounds; concentration of an organic compound was 0.3 weight percent for all slurries on FIG. 2, pH has been adjusted to 2.2.

As shown in FIG. 2, selectivity of the slurry A (containing ALS) is about four time higher than selectivity of the slurry D (containing TEA-DDBS).

Thus, the selectivity of oxide:nitride film removal of the aqueous slurry of the present invention might be adjusted to meet requirements of a particular STI CMP process by using different of the aforementioned organic compounds.

While the invention has been described in detail with reference to specific embodiments thereof, it will become

What is claimed is:

1. A high selectivity aqueous slurry composition, comprising: non-modified silica based abrasive particles in an amount of about 5 to about 50 weight percent, and an organic compound in an amount of about 0.001 to about 2.0 weight percent in an aqueous solution, wherein a silicon oxide to silicon nitride selectivity ranges from about 50 to about 700.

2. The high selectivity aqueous slurry composition of claim 1, wherein the non-modified silica based abrasive particles are selected from the group consisting of colloidal silica, fumed silica, precipitated silica particles, and powder milled silicon dioxide.

3. The high selectivity aqueous slurry composition of claim 1, wherein the non-modified abrasive particles colloidal and have an average particle size of about 10–200 nm.

4. The high selectivity aqueous slurry composition of claim 1, wherein the organic compound is a high selectivity enhancing compound selected from the family of sulfates of alcohol, sulfonic acid and their salts, sulfuric acid ether salts and mixtures thereof.

5. The high selectivity aqueous slurry composition of claim 4, wherein the organic compound from the family of sulfonic acid salts is selected from the group consisting of alkyl benzene sulfonic acids, sulfonates of dodecyl- and tridecylbenzenes, sufonates of naphthalene, and sulfonates of alkyl naphtalene.

6. The high selectivity aqueous slurry composition of claim 4, wherein the organic compound from the family of alcohol sulfates of ammonium, sodium, potassium, magnesium and calcium selected from the group consisting of lauryl sulfates, decylsylfates, octylsulfates, ethylhexylsulfates, ethylhexylsulfates, alkylsulfates of amines.

7. The high selectivity aqueous slurry composition of claim 1, wherein the organic compound from the family of sulfuric acid ether salts is selected from the group consisting of higher alcohol ether sulfates of ammonium, higher alcohol ether sulfates of sodium, and alkyl phenol ether sulfates.

8. The high selectivity aqueous slurry composition of claim 1, wherein the organic compound is present in an amount of about 0.05 to about 1.5 weight percent.

9. The high selectivity aqueous slurry composition of claim 1, further comprising pH adjusting compounds, pH buffers, surface active agents and viscosity modifiers.

10. The high selectivity aqueous slurry composition of claim 1, having a pH in the range of about 1.5 to about 8.

11. A method of chemical mechanical polishing/planarization (CMP) of a semiconductor composite device, comprising:
applying a high selectivity slurry at a polishing interface between a polishing pad and the composite device, the composite device including silicon oxide and silicon nitride, and the high selectivity slurry comprising non-modified silica based abrasive particles in an amount of about 5 to about 50 weight percent, and an organic compound in an amount of about 0.001 to about 2.0 weight percent in an aqueous solution, and
selectively polishing silicon oxide in preference to silicon nitride at a selectivity ranging from about 50 to about 700.

12. The CMP method in accordance with claim 11, wherein the organic compound is a high selectivity enhancing compound selected from the family of sulfonic acid and their salts, sulfuric acid ester salts, sulfates of alcohol and mixtures thereof.

13. The CMP method in accordance with claim 11, wherein the organic compound is present in an amount of about 0.05 to about 1.5 weight percent.

14. The CMP method in accordance with claim 11, wherein the non-modified silica based abrasive particles are selected from the groups consisting of colloidal silica, fumed silica, precipitated silica particles and powder milled silicon dioxide.

15. The CMP method in accordance with claim 11, wherein the silica based abrasive particles have an average particle size of about 10–200 nm.

16. The CMP method in accordance with claim 11, wherein the high selectivity slurry comprising pH adjusting compounds, pH buffers, surface active agents and viscosity modifiers.

17. The CMP method in accordance with claim 11, wherein the high selectivity slurry includes surface active agents regulating the surface tension of the slurry.

18. The CMP method in accordance with claim 11, wherein the high selectivity slurry has a pH in the range of about 1.5 to about 8.

19. A method for polishing/planarizing a shallow trench isolation structure, comprising the steps of:
providing a high selectivity slurry comprising non-modified abrasive particles in an amount of about 5 to about 50 weight percent, and an organic compound in an amount of about 0.001 to about 2.0 weight percent in an aqueous medium;
applying the high selectivity slurry at a polishing/planarizing interface between a polishing pad and a device comprised of silicon oxide and silicon nitride; and
selectively polishing silicon oxide in preference to silicon nitride at selectivity ratio ranging from about 50 to about 700.

20. A method of making a high selectivity aqueous slurry composition, comprising: providing non-modified silica based abrasive particles in an amount of about 5 to about 50 weight percent, and an organic compound in an amount of about 0.001 to about 2.0 weight percent in an aqueous solution, wherein a silicon oxide to silicon nitride selectivity ranges from about 50 to about 700.

21. The method of making the slurry composition of claim 20, further comprising:
adding a pH adjusting compounds, pH buffers, surface active agents and viscosity modifiers.

22. The method of making the slurry composition of claim 20, wherein the organic compound is a high selectivity enhancing compound selected from the family of sulfonic acid and their salts, sulfates of alcohol, sulfuric acid ether salts and mixtures thereof.

* * * * *